United States Patent
Nishiura et al.

[11] Patent Number: 5,961,029
[45] Date of Patent: Oct. 5, 1999

[54] WIRE BONDING METHOD

[75] Inventors: Shinichi Nishiura, Fussa; Tooru Mochida, Higashiyamato, both of Japan

[73] Assignee: Kabushiki Kaisha Shinkawa, Tokyo, Japan

[21] Appl. No.: 09/005,789

[22] Filed: Jan. 12, 1998

[30] Foreign Application Priority Data

Jan. 13, 1997 [JP] Japan .................................. 9-014798

[51] Int. Cl.$^6$ .............................. B23K 31/02; B23K 1/06
[52] U.S. Cl. ...................... 228/180.5; 228/1.1; 228/110.1
[58] Field of Search ............................. 228/180.5, 110.1, 228/1.1, 4.5, 102; 219/56.1, 56.22, 56.21; 140/112

[56] References Cited

U.S. PATENT DOCUMENTS

| | | | |
|---|---|---|---|
| 4,327,860 | 5/1982 | Kirshenboin et al. | 228/179 |
| 4,597,522 | 7/1986 | Kobayashi | 228/179 |
| 4,932,584 | 6/1990 | Yamazaki et al. | 228/179 |
| 5,148,964 | 9/1992 | Shimizu | 228/102 |
| 5,156,323 | 10/1992 | Kumazawa et al. | 228/179 |
| 5,158,223 | 10/1992 | Simizu | 228/1.1 |
| 5,192,018 | 3/1993 | Terakado et al. | 228/179 |
| 5,205,463 | 4/1993 | Holdgrafer et al. | 228/102 |
| 5,259,548 | 11/1993 | Yamazaki et al. | 228/180.5 |
| 5,452,841 | 9/1995 | Sibata et al. | 228/180.5 |

FOREIGN PATENT DOCUMENTS

| | | |
|---|---|---|
| 4-318943 | 11/1992 | Japan . |
| 5-60657 | 9/1993 | Japan . |

*Primary Examiner*—Patrick Ryan
*Assistant Examiner*—Kiley Stoner
*Attorney, Agent, or Firm*—Koda & Androlia

[57] ABSTRACT

A method for connecting a first bonding point and a second bonding point with a wire comprising the steps of: raising a capillary through which the wire passes slightly after the second reverse operation that involves the movement of the capillary in the opposite direction from a second bonding point, moving the capillary to a position which is more or less above the first bonding pint, and then raising the capillary while delivering the wire; resulting in the formation of a kink in the inclined portion of a trapezoidal wire loop employed in the wire connection in semiconductor devices.

2 Claims, 4 Drawing Sheets

WIRE BONDING METHOD

BACKGROUND OF THE INVENTION

1. Field of the Invention

The present invention relates to a wire bonding method for connecting a first bonding point and a second bonding point with a wire in a semiconductor device manufacturing process, and more particularly to a loop formation method in such a bonding method.

2. Prior Art

As shown in FIG. 4(a) and 4(b), in a semiconductor device, a pad 2a (first bonding point) on a semiconductor chip 2 mounted on a lead frame 1 and a lead 1a (second bonding point) on the lead frame 1 are connected by a bonding wire (called merely "wire") 3. The loop shape of the wire 3 in this case may be a trapezoidal loop shape as shown in FIG. 4(a) or a triangular loop shape as shown in FIG. 4(b).

Wire loop formation methods of this type are described in, for example, Japanese Patent Application Publication (Kokoku) No. 5-60657 and Japanese Patent Application Laid-Open (Kokai) No. 4-318943.

The trapezoidal loop shown in FIG. 4(a) is formed by the process shown in FIG. 5.

In step (a) shown in FIG. 5, a capillary 4 is lowered so that a ball (not shown) formed on the tip end of the wire 3 is bonded to a first bonding point A. This is done while a damper (not shown), which is located above the capillary 4 and can hold the wire when closed and feed the wire when opened, is opened. After this, the capillary 4 is raised to point B while delivering the wire 3.

Next, as seen in step (b), the capillary is moved horizontally in the opposite direction from the second bonding point G to point C. Generally, to move the capillary 4 in the direction opposite from the second bonding point G (for forming a loop in the wire) is referred to as a "reverse operation". Because of this reserve operation, the wire 3 assumes a shape that extends from point A to point C; and as a result, a kink 3a is formed in a portion of the wire 3. The wire 3 delivered out of the capillary in the process from point A to point C forms the neck height portion 31 of the loop shown in FIG. 4(a).

Next, in step (c), the capillary 4 is raised to point D while delivering the wire 3.

Afterward, as shown in step (d), the capillary 4 is again moved horizontally to point E in the opposite direction from the second bonding point G, i. e., another (or second) reverse operation is performed. As a result, the wire 3 assumes a shape inclined From point C to point E, and a kink 3b is formed in a portion of the wire 3. The wire 3 delivered out of the capillary 4 in the process from point C to point E forms the trapezoidal length portion 32 shown in FIG. 5(a).

Furthermore, in step (e), the capillary 4 is raised to point F while delivering the wire 3. The amount of wire 3 delivered out of the capillary is equal to the inclined portion 33 shown in FIG. 5(a). Afterward, the damper (again, not shown) is closed. Once the damper is closed, the wire 3 is not delivered even if the capillary 4 subsequently is moved.

As shown in steps (f) and (g), the capillary 4 next makes a circular-arc motion (or a circular-art motion followed by a straight down motion) so that the capillary 4 is positioned at the second bonding point G, and the wire 3 is bonded to the second bonding point G, thus connecting the first and second bonding points A and G.

On the other hand, the triangular loop shown in FIG. 4(b) is formed by the process shown in FIG. 6.

In this triangular loop formation, the trapezoidal length portion 32 described in the above trapezoidal loop formation is not formed. Accordingly, the second reverse operation in step (d) in FIG. 5 is not performed. Thus, the steps (c), (d) and (e) in FIG. 6 are replaced by the single process as shown in step (c) of FIG. 6. In particular, the steps (a) and (b) are the same as the steps (a) and (b) shown in FIG. 5, respectively; and after the first reverse operation in step (b) of FIG. 6, the capillary 4 is raised to point F while delivering the wire 3 in step (c). Afterward, the capillary 4 performs the operations steps (d) and (e) in the same manner as the operations done in the steps (f) and (g) shown in FIG. 5, so that the wire 3 is bonded to the second bonding point G.

As seen from the above, the triangular loop formation shown in FIG. 6 is simpler than the trapezoidal loop formation shown in FIG. 5 and is therefore advantageous in that the loop formation is performed in a shorter time. However, in cases where the height difference between the first bonding point A and the second bonding point G is large (for instance, about 100–350 $\mu$m), or in cases there is a significantly large distance (for instance, about 500 $\mu$m)between the first bonding point A and the edge portion of the semiconductor chip 2, the wire 3 tends to come into contact with the edge portion of the semiconductor chip 2 when the triangular wire loop shape as shown in FIG. 4(b) is formed. In such cases, the trapezoidal wire loop formation is employed so as to avoid the contact between the wire 3 and semiconductor chip 2.

In the trapezoidal loop formation process shown in FIG. 5, the kinks 3a and 3b are not more easily formed when locations of these kinks are set to be higher from the first bonding point A. Thus, the kink 3a can be formed relatively easier since the first reverse operation is formed when the capillary 4 is at the position as high as the bonding point A. However, the second reverse operation for forming the second kink 3b in step (d) in FIG. 5 is performed with the capillary 4 in a high position which is far away from the first bonding point A. As a result, the portion of the wire in the vicinity of the kink 3b (see FIG. 4(a)) tends to unstable and has a weak shape-retaining strength, and therefore, this portion of the wire in the vicinity of the kink 3b may rise up or drop downward. If the shape-retaining strength of the portion of the wire near the kink 3b is weak, the wire may bend when pressure from the outside is applied thereon. For example, wire bending may easily be caused by external forces such as shocks or vibration of the wire 3 due to capillary contact or ultrasonic oscillation during bonding to the second bonding point G, or mold flow due to the injection of molding material during molding, etc.

SUMMARY OF THE INVENTION

Accordingly, the object of the present invention is to provide a wire bonding method which solves the problems with trapezoidal loops and makes it possible to form a stable wire loop shape which has a high shape-retaining strength.

The object of the present invention is accomplished by a unique method in which a first bonding point and a second bonding point are connected by a wire, and the method is characterized in that it comprises: a process in which the wire is connected to the first bonding point; a process of a first reverse operation in which the capillary is raised slightly and then caused to move slightly in the opposite direction from the second bonding point is performed; a process of a second reverse operation in which the capillary is raised and then caused to move in the opposite direction from the second bonding point is performed; a process is performed in which the capillary is raised and then caused to move toward the second bonding point; and a process is performed in which the capillary is raised delivering the wire, the capillary is moved toward the second bonding point, and then the wire is connected to the second bonding point.

DETAILED DESCRIPTION OF THE INVENTION

Figure 1:
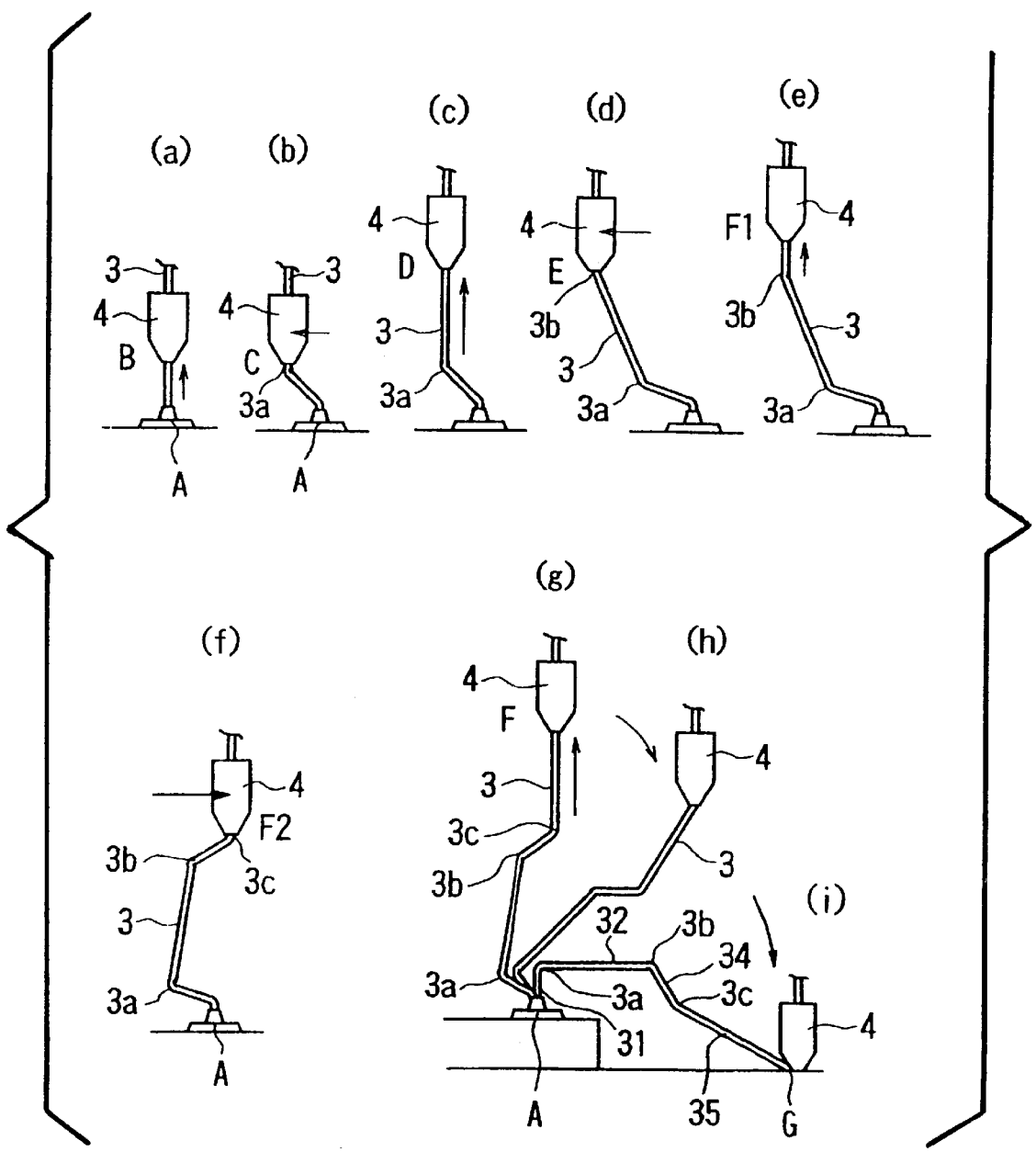
FIG. 1a–1i is an explanatory diagram which illustrates steps of a wire bonding method according to one embodiment of the present invention.

One embodiment of the present invention will be described with reference to FIGS. 1 through 3. Constituting elements which are the same as or correspond to those in FIG. 4(a) and FIG. 5 will be labeled with the same symbols in the following description. In the present embodiment, the step (e) shown in FIG. 5 for the trapezoidal loop is changed to steps (e) through (g) of FIG. 1, and the remaining steps are the same as those shown in FIG. 5. In other words, the steps (a) through (d) in FIG. I correspond to the steps (a) through (d) in FIG. 5, and the steps (h) and (i) in FIG. 1 correspond to the steps (f) and (g) in FIG. 5.

First, the steps (a) through (d) in FIG. 1, which are the same as in a conventional method, will be described.

In step (a), the capillary 4 is lowered so that the ball (not shown) formed at the end of the wire 3 that passes through the capillary 4 is bonded to the first bonding point A. This is done while a damper (not shown), which can hold the wire 3 when closed and feed the wire 3 when opened, is opened. After bonding the ball (or wire) to the first bonding point A, the capillary 4 is raised to point B while delivering the wire 3.

Next, as shown in step (b), a reverse operation is performed. In other words, the capillary 4 is moved horizontally to point C in the direction opposite from the second bonding point G. As a result, a kink 3a is formed in a portion of the wire 3 in the same manner as in a conventional method. The wire 3 delivered out of the capillary 4 during the process from point A to point C forms a neck height portion 31 of the wire loop (see FIG. 2).

Next, as shown in step (c), the capillary 4 is raised to point D while delivering the wire 3. Afterward, in step (d), the capillary 4 is moved in the direction opposite from the second bonding point G. In other words, a second reverse operation is performed so that the capillary 4 is moved horizontally to point E. As a result of the operation from point C to point E, a kink 3b is formed in the wire 3. The wire 3 delivered out of the capillary 4 during the process from point C to D forms the trapezoidal length portion 32 of the wire loop (see FIG. 2).

Next, the steps which characterize the present invention are performed.

As shown in step (e), the capillary 4 is raised to point F1 while delivering the wire 3. Then, in step (f), the capillary 4 is moved toward the second bonding point G. After this movement, as shown in step (g), the capillary 4 is raised to point F while delivering the wire 3.

As a result of these steps (e) through (g), a kink 3c is formed in the wire 3. The length from the kink 3b to the kink 3c corresponds to the first inclined portion 34 shown in FIG. 2, and the wire 3 delivered in step (g) forms the second inclined portion 35 shown in FIG. 2.

At the end of the step (g), as in a conventional method, the damper (not shown) is closed. Once the damper is thus closed, the wire 3 is not delivered out of the capillary 4 even if the capillary 4 is subsequently moved.

Next, as shown in steps (h) and (i), the capillary 4 is moved horizontally toward the second bonding point G and caused to perform a circular-arc motion (or a circular-arc motion followed by a straightly lowering motion) so that the capillary 4 is positioned at the second bonding point G; and then the wire 3 is bonded to the second bonding point G. In the above steps, the operation from point F to the second bonding point G has no direct connection with the gist of the present invention. Accordingly, it is possible to perform an operation similar to the operation disclosed in the conventional example or to perform some other type of operation.

Figure 2:
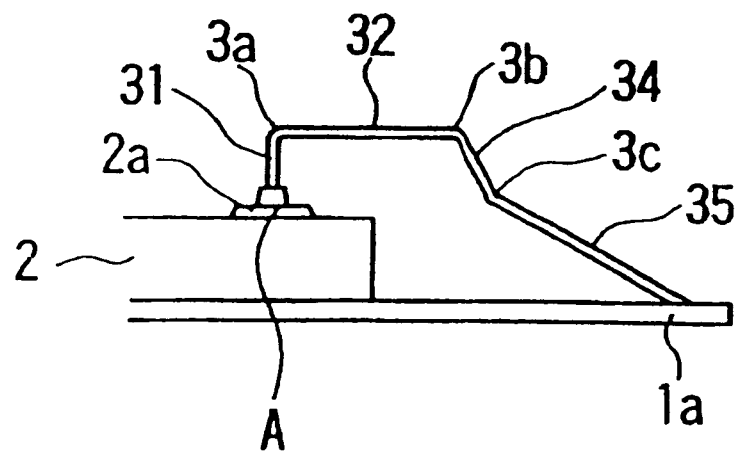
FIG. 2 is a diagram which illustrates the connected the wire.
Figure 3:
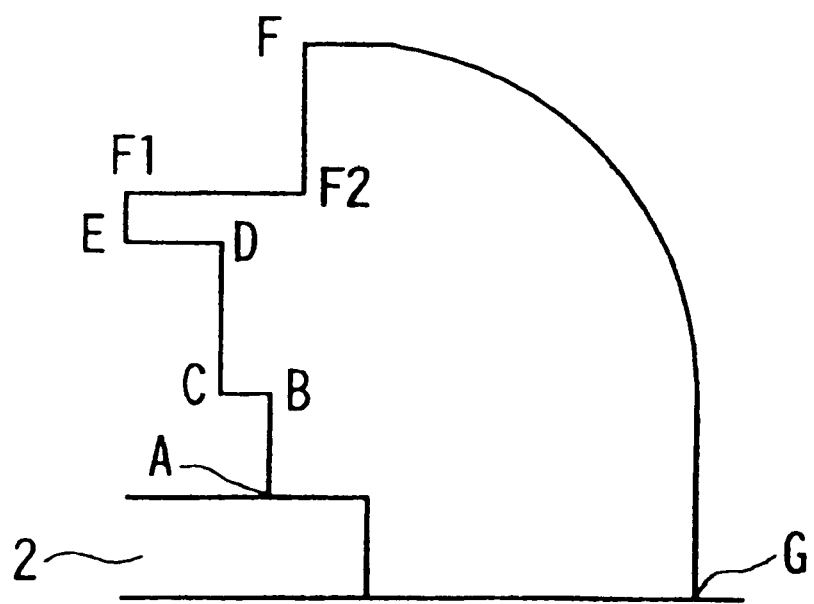
FIG. 3 is a diagram which illustrates the path of the capillary.
Figure 4A:
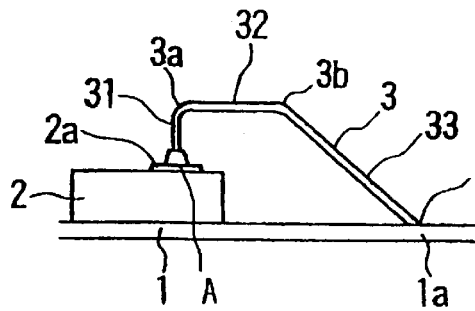
FIG. 4(a) shows the trapezoidal wire loop and FIG. 4(b) shows the triangular wire loop of the prior art.
Figure 4B:
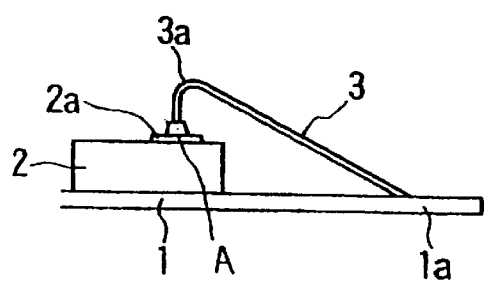
Figure 5:
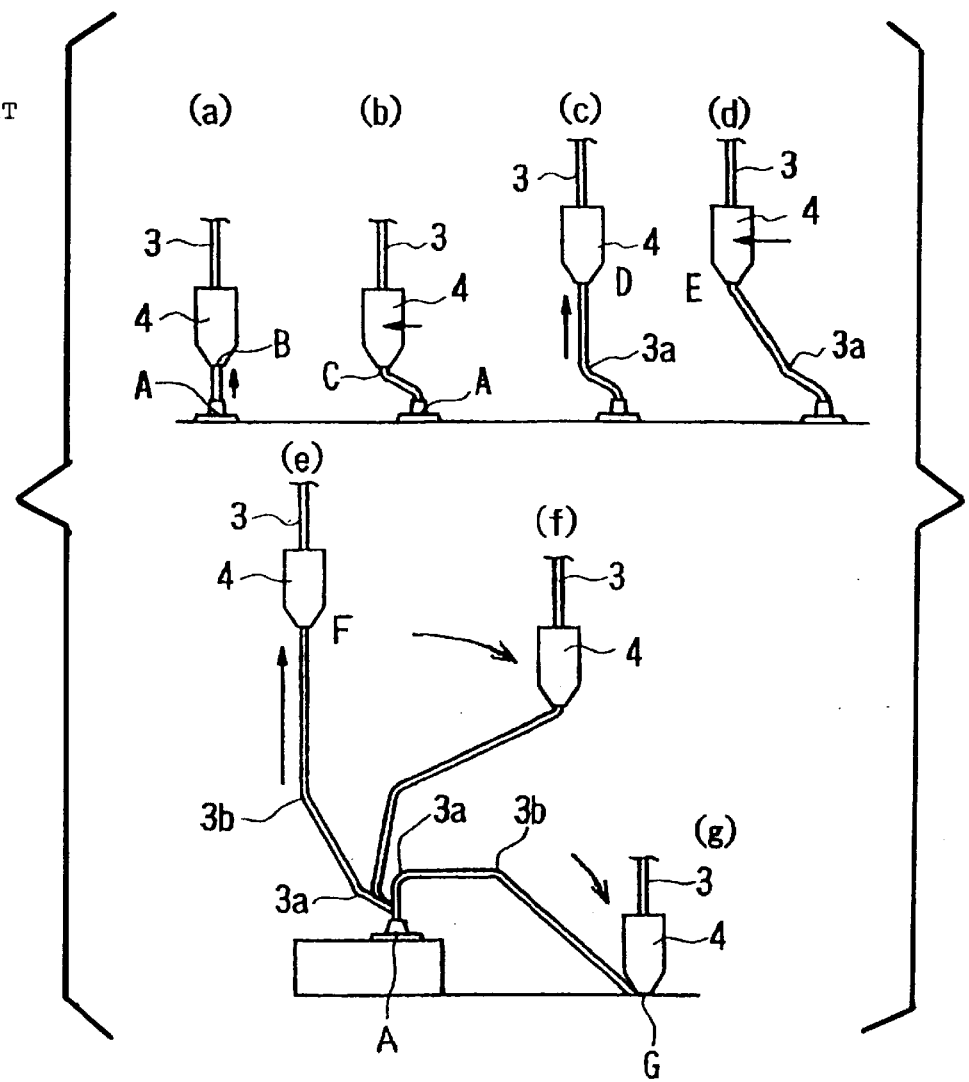
FIG. 5a–5g shows the steps of the prior art to form the trapezoidal wire loop.
Figure 6:
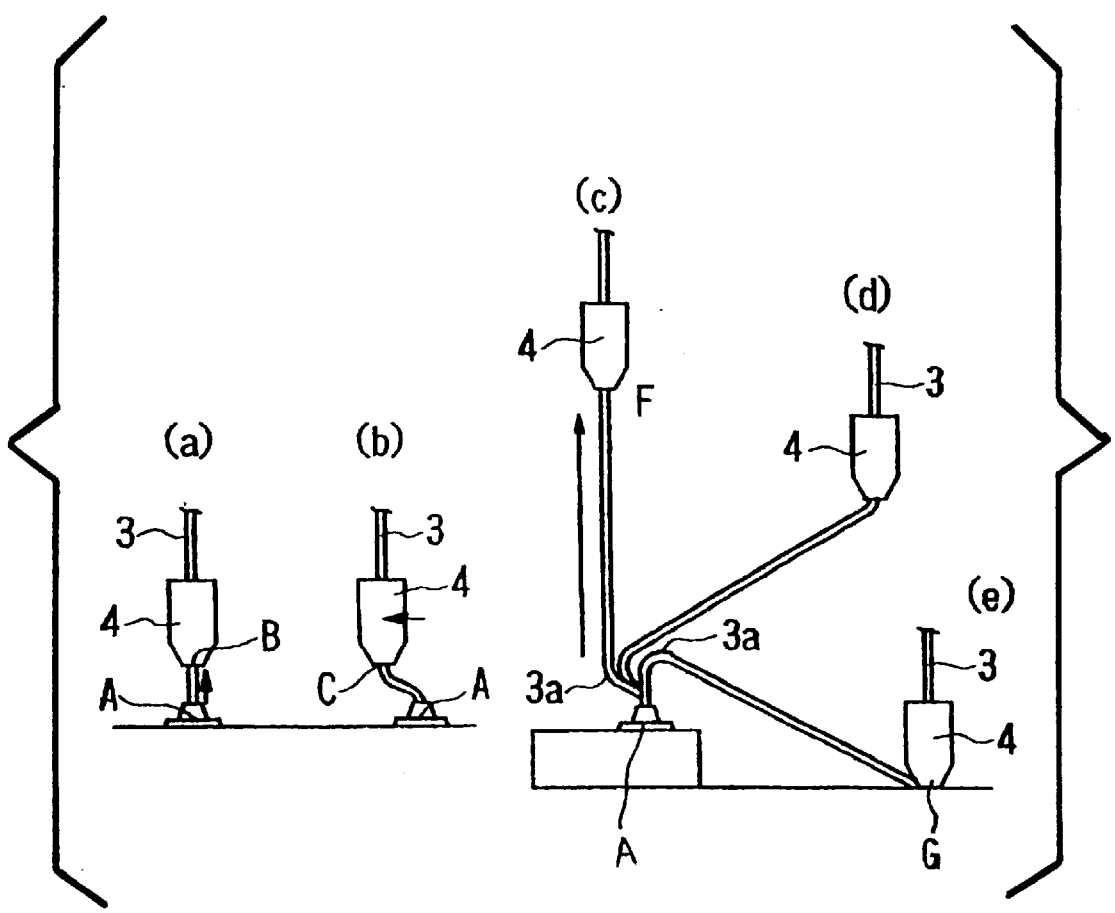
FIG. 6a–6e shows the steps of the prior art to form the triangular wire loop.

As seen from the above, in the present invention, the inclined portion 33 shown in the prior art wire loop in FIG. 4(a) comprises two inclined portions: the first inclined portion 34 and the second inclined portion 35 as shown in FIG. 2. In other words, in the present invention, a kink 3c is formed in the inclined portion 33 so that the area of the kink 3b is stabilized. As a result of the formation of the kink 3c, a stronger king 3b is obtained in a high position which is distant from the first bonding point A. In addition, a wire loop shape that has a high shape retaining strength can be formed.

According to the present invention, the capillary is raised slightly after a second reverse operation in which the capillary is moved in the opposite direction from the second bonding point; afterward, the capillary is moved to a position which is more or less above the first bonding point; and then the capillary is raised while delivering the wire. Accordingly, a kink is formed in the inclined portion of the trapezoidal loop. As a result, a stable loop shape can be obtained not only in the case of short loops with a short wiring distance but also in the case of long loops with a long wiring distance. Furthermore, a loop which has a high shape retention strength against pressure applied from the outside can be obtained. Thus, bending of the wire by external pressure can be prevented. For example, the obtained loop shape has a high shock absorption capability with respect to external forces such as shocks to the wire or vibration of the wire due to contact with the capillary, ultrasonic vibration during bonding to the second bonding point, or the flow of molding material caused by injection during molding, etc. Accordingly, bending of the wire can be prevented. Furthermore, a rising loop shape, which tends to be generated in loops on semiconductor devices which contain slight height difference between the first and second bonding points, can be suppressed by the kink formed in the inclined portion of the loop.

What is claimed is:

1. A wire bonding method wherein a first bonding point and a second bonding point are connected by a wire, the method comprising the steps of:

connecting a wire to a first bonding point;

performing a first reverse operation in which said capillary is raised slightly and then caused to move slightly in the opposite direction from said second bonding point;

performing a second reverse operation in which said capillary is raised and then caused to move in the opposite direction from said second bonding point;

raising said capillary and then moving said capillary toward said second bonding point; and performing a process in which said capillary is raised delivering said wire from said capillary, after which said capillary is moved toward said second bonding point and then said wire is connected to said second bonding point.

2. A wire bonding method wherein a first bonding point and a second bonding point are connected by a wire that passes through a capillary, the method comprising the steps of:

connecting said wire to said first bonding point;

raising said capillary while delivering said wire;

moving said capillary in a direction opposite from said second bonding point;

raising said capillary while delivering said wire;

moving said capillary in a direction opposite from said second bonding point;

raising said capillary while delivering said wire;

moving said capillary toward said second bonding point;

raising said capillary while delivering said wire;

moving said capillary toward said second bonding point without delivering said wire; and connecting said wire to said second bonding point.

* * * * *